United States Patent
Yang et al.

(10) Patent No.: US 8,627,167 B1
(45) Date of Patent: Jan. 7, 2014

(54) METHODS AND APPARATUS FOR PROVIDING MULTI-LAYERED CODING FOR MEMORY DEVICES

(75) Inventors: Xueshi Yang, Sunnyvale, CA (US); Gregory Burd, San Jose, CA (US); Zining Wu, Los Altos, CA (US)

(73) Assignee: Marvell International Ltd., Hamilton (BN)

( * ) Notice: Subject to any disclaimer, the term of this patent is extended or adjusted under 35 U.S.C. 154(b) by 1210 days.

(21) Appl. No.: 11/968,556

(22) Filed: Jan. 2, 2008

Related U.S. Application Data

(60) Provisional application No. 60/883,858, filed on Jan. 8, 2007.

(51) Int. Cl.
*H03M 13/00* (2006.01)

(52) U.S. Cl.
USPC ........... 714/755; 714/752; 714/758; 714/781; 714/782; 714/784

(58) Field of Classification Search
None
See application file for complete search history.

(56) References Cited

U.S. PATENT DOCUMENTS

| | | | | |
|---|---|---|---|---|
| 5,224,106 A * | 6/1993 | Weng | ............................. | 714/755 |
| 5,844,918 A * | 12/1998 | Kato | ............................. | 714/751 |
| 5,946,328 A * | 8/1999 | Cox et al. | ...................... | 714/784 |
| 6,173,431 B1 * | 1/2001 | Rittle | ............................. | 714/778 |
| 6,903,887 B2 * | 6/2005 | Asano et al. | ..................... | 360/31 |
| 7,263,650 B2 * | 8/2007 | Keeler et al. | .................. | 714/769 |
| 7,389,463 B2 * | 6/2008 | Ramaswamy et al. | ........ | 714/752 |
| 7,895,502 B2 * | 2/2011 | Han et al. | ...................... | 714/764 |
| 8,255,761 B1 * | 8/2012 | Pi et al. | ......................... | 714/752 |
| 2002/0056064 A1 * | 5/2002 | Kidorf et al. | .................. | 714/755 |
| 2007/0049990 A1 * | 3/2007 | Klostermann et al. | .......... | 607/60 |
| 2008/0229147 A1 * | 9/2008 | Earhart et al. | .................. | 714/15 |
| 2009/0313526 A1 * | 12/2009 | Neuman | ...................... | 714/758 |

\* cited by examiner

*Primary Examiner* — Albert DeCady
*Assistant Examiner* — Justin R Knapp

(57) ABSTRACT

Systems and methods are provided for recovering data stored in memory. A group of data is encoded using a first layer of code to form a first encoded group of data. Individual portions of the first encoded group of data are then encoded using a second layer of code to form a second encoded group of data. A processor may request access to an individual portion of the group of data. The encoded version of the requested individual portion is retrieved from memory and decoded using the second layer of code to recover the requested individual portion. If the recovery of the requested individual portion fails, the remaining encoded portions of the group are retrieved from memory and decoded using the first layer of code to recover the requested individual portion.

23 Claims, 12 Drawing Sheets

METHODS AND APPARATUS FOR PROVIDING MULTI-LAYERED CODING FOR MEMORY DEVICES

CROSS REFERENCE TO RELATED APPLICATION

This application claims the benefit of U.S. Provisional Application No. 60/883,858, filed Jan. 8, 2007, which is hereby incorporated by reference herein in its entirety.

BACKGROUND OF THE INVENTION

The present invention is directed to methods and apparatus for providing multi-layered coding for memory devices, and more particularly encoding and decoding data in multiple layers to efficiently maintain data integrity.

Typically data storage systems store data in non-volatile memory devices, e.g., flash memory devices. Such memory devices, however, may be unreliable in some circumstances due to programming imperfections or defects that may cause errors in the stored information. For example, flash memory devices contain cells with statistically varying voltage threshold, which result in varying read-out current. Such variation in the read-out current reduces the margin between signal levels and may lead to read-out errors. Thus, correction schemes become critical for compensating for the read-out errors.

Data may be stored and organized in memory devices, e.g., non-volatile memory devices, in a structured paradigm. The structured paradigm may be made up of multiple allocation units which may be the smallest element of data that includes, for example, 512 bytes of data. Each of these allocation units is typically referred to as a page of data. A group of these allocation units (i.e., pages of data) form a larger data packet of the structured paradigm and may be referred to as a data sector. Data sectors may include four pages of data. A data file may be spread across many data sectors or may reside in a fractional data sector occupying, for example, less than four pages of data. A processor or controller may retrieve data either in pages or sectors.

Correction schemes, known as coding mechanisms, may include Cyclic Codes, among others, and may in some limited circumstances correct and/or detect errors in data read from memory devices using parity bits that are appended to the data stored in the memory. These correction schemes, however, may reduce the efficiency of the overall system because the correction schemes may compute parity bits across multi-page units (e.g., a data sector) and may therefore require large blocks of data (e.g., data sectors) to be read in order to perform the correction, thereby preventing the processor from reading the data one page at a time. Alternatively, if the CRC is performed on a page-by-page basis, the integrity of the data is reduced because less correction/detection is possible.

SUMMARY OF THE INVENTION

In accordance with the principles of the present invention, methods and apparatus are provided for providing multi-layered coding for memory devices.

In some embodiments, a group of data may include individual portions of data. The individual portions of the group of data may initially be encoded jointly by a first layer encoder. The first layer encoder may be a systematic encoder such as a Reed-Solomon Code. Each individual portion of the group of data may then be encoded individually or independently of the other portions using a second layer encoder. The second layer encoder may be another Reed-Solomon Code of a smaller complexity or may otherwise operate on a smaller scale. The encoded group of data including the coding information generated by each of the first and second layer encoders may be stored in a memory.

In some embodiments, the encoded data may be further encoded by a third layer of code or a channel encoder prior to being stored in the memory.

A processor may request access to one of the portions of the group of data. The encoded portion, including the second layer and third layer (if applicable), may be retrieved from the memory and provided to the decoder. The decoder may decode initially the third layer if one exists and subsequently decode the second layer of code to recover the portion of data. If the second layer is decoded successfully, the recovered portion is provided to the requesting processor. This obviates the need to retrieve the entire encoded group of data to recover one of the portions of the group and thus makes the system more efficient.

If, on the other hand, the second layer decoder fails, the remaining portions of the group, including the first layer of coding information, may be retrieved. The decoder may decode the third layer if one exists and subsequently decode the second layer of code to recover the remaining portions of data. Each of the recovered portions of data including the portion of data which the second layer decoder failed to decode are then combined with the first layer of code and decoded jointly using the first layer decoder. The first layer decoder outputs the recovered group of data and may provide the requested portion to the processor.

Accordingly, the efficiency of the memory system is increased because the remaining portions of the group (which may not have been requested by a processor) are decoded using the first layer only when the second layer decoder fails to decode the requested portion of the group. Moreover, the data integrity is enhanced by using adding an additional layer of protection (e.g., the second layer of code) to the encoded data to increase the likelihood of data recovery.

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

Figure 1:
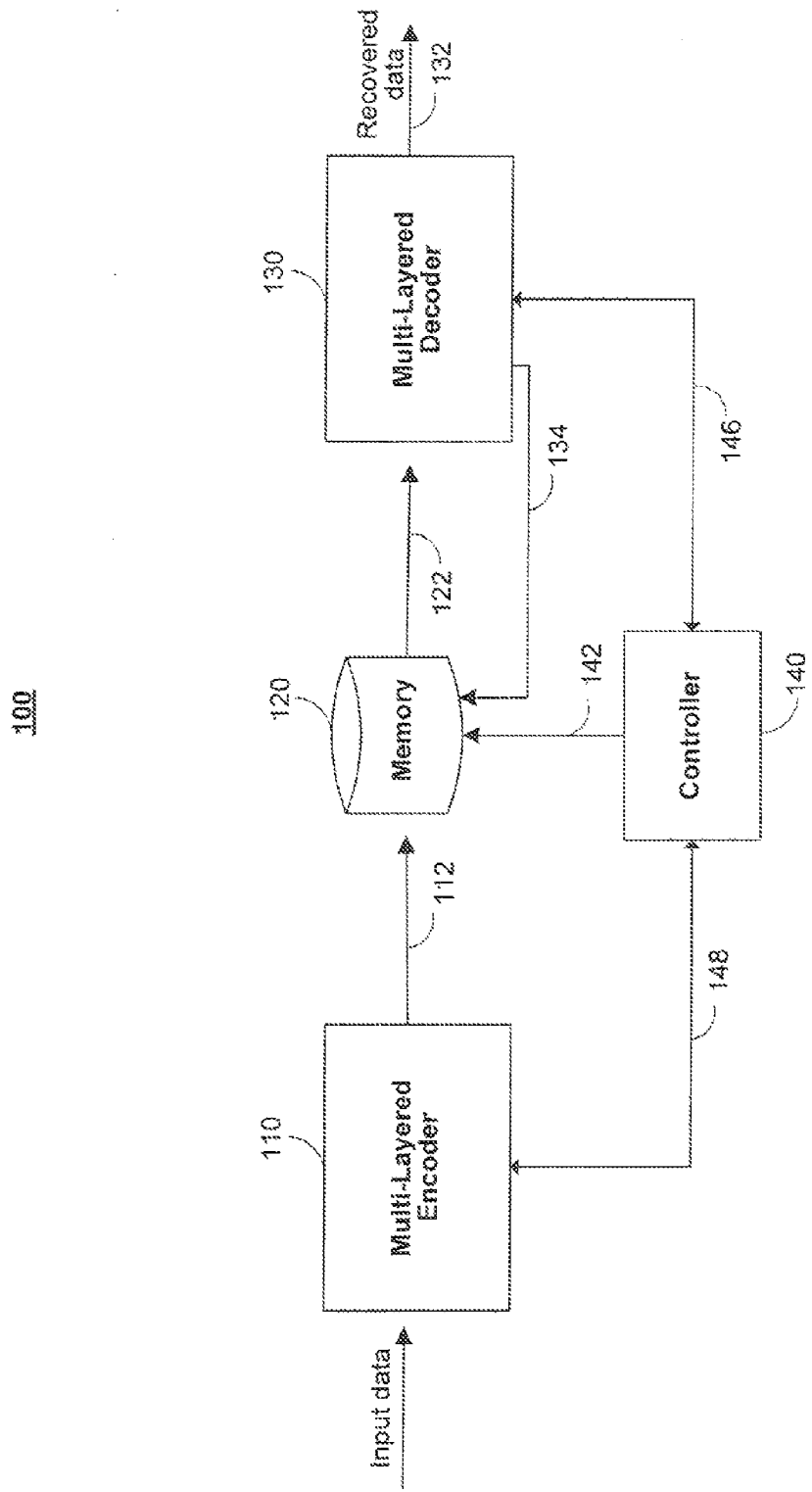
FIG. 1 is a diagram of an illustrative multi-layered coding system in accordance with an embodiment of the present invention.

FIG. 1 is a diagram of an illustrative multi-layered coding system 100 in accordance with an embodiment of the present invention. System 100 may include a multi-layered encoder 110, a memory 120, a multi-layered decoder 130 and a controller 140. Controller 140 may be coupled to encoder 110 via communications link 148, to memory 120 via communications link 142 and to decoder 130 via communications link 146.

Controller 140 may instruct encoder 110 to begin encoding an input data stream to generate an encoded data stream 112. Encoder 110 may encode the input data stream in multiple layers. For example, encoder 110 may encode a group of data (e.g., multiple pages of data) that form, for example, a data sector jointly as a first encoded layer (also referred to herein as "first layer"). Encoder 110 may then encode portions of the group (e.g., each page that is included in the data sector) individually to form a second encoded layer (also referred to herein as "second layer"). It should be understood that encoder 110 may alternatively encode larger blocks of data, such as multiple data sectors, jointly (each including multiple pages of data) as the first layer and then encode each data sector that is included in the multiple data sectors block individually as the second layer, or perform multi-layered encoding of data in any other suitable manner. Additionally, an optional third layer of encoding may be provided as the channel-encoded layer. The third layer of encoding may perform an encoding operation on the encoded first and second layers. The operation of encoder 110 will be described in more detail in connection with the description of FIG. 2.

Encoded data stream 112 may be stored in memory 120 at an address provided by controller 140. Encoder 110 may provide status information regarding an encoding operation to controller 140 via communications link 148. Such status information may indicate when encoder 110 completes encoding data and/or whether an encoding process succeeded or failed. Memory 120 may be any type of volatile or non-volatile memory device including flash memory devices.

Controller 140 may receive a request from a processor for data stored at a particular location in memory 120 (e.g., a request for a page of data). Controller 140 may provide an address via communications link 142 to memory 120 for reading out the data stored in memory 120 at the requested location. The data that is read out of memory 120 may be encoded data 122. Encoded data 122 may be provided to decoder 130 to recover the data that was initially received by encoder 110 prior to being encoded. As defined herein the term "recover" means to recreate an estimate of originally received data that has been previously encoded. Recovering may require decoding encoded data, correcting errors that may be present in the encoded data, or both, to produce an estimate of the originally received data (represented in FIG. 1 as recovered data 132). The recovered data 132 (e.g., a page of data) may be provided to the requesting processor.

Controller 140 may instruct decoder 130 to begin decoding encoded data 122 to recover data. Encoded data 122 that is read from memory 120 may be only a portion of a group of data that was encoded. For example, encoded data 122 may be an encoded page of an encoded data sector. Reading data out of memory 120 on an encoded page-by-page basis increases the efficiency of system 100. In particular, the requesting processor may require access to only a page of data. System 100 may retrieve the requested page and decode the page to recover the data without retrieving the other pages in the data sector. Thus, the efficiency of system 100 is increased.

Decoder 130 may decode encoded data 122 retrieved from memory 120 in multiple layers and (in one implementation) in the reverse order in which the data was encoded by encoder 110. For example, decoder 130 may first apply channel decoding to the encoded data portion to decode the third layer of encoding if one was used by encoder 110. Decoder 130 may then decode the second layer of the data portion after the third layer has been decoded. If the second layer of decoding is successful, the data portion (e.g., page of data) that is recovered may be provided to the requesting processor. However, when the second layer of decoding fails, controller 140 (or optionally decoder 130) may read the remaining encoded portions of the group of data from memory 120 to decode the first layer. Decoding the group of data portions jointly using the first layer may correct errors in the requested portion of data (e.g., the page of data) that the second layer decoder failed to decode. Thus, the first layer of encoding provides an additional layer of protection in case one of the other decoding layers fails. Moreover, the benefits of providing encoding on large blocks of data are provided without requiring all of the data portions of the large block of data to be read out every time, thereby increasing the overall efficiency of the memory system. The operation of decoder 130 will be described in more detail in connection with the description of FIGS. 3 and 4.

Decoder 130 may provide status information regarding a decoding operation to controller 140 via communications link 146. Such status information may indicate when decoder 130 completes decoding data and/or whether a decoding process succeeded or failed. Controller 140 may use this information to, for example, instruct memory 120 to output additional portions of a group of data when decoder 130 fails to decode a particular data portion of the group (e.g., using the second layer of decoding) and requires the remaining portions of the group of data to decode the group portions jointly (e.g., using the first layer of decoding).

Communications links 148, 112, 142, 122, 134 and 146 may be any wired or wireless communications medium. For example, one or more of the communications links may be short-range point-to-point communication paths, such as USB cables, IEEE 1394 cables, wireless paths (e.g., Bluetooth, infrared, IEEE 802-11x, etc.), or other short-range communication via wired or wireless paths. BLUETOOTH is a certification mark owned by Bluetooth SIG, INC.

Figure 2:
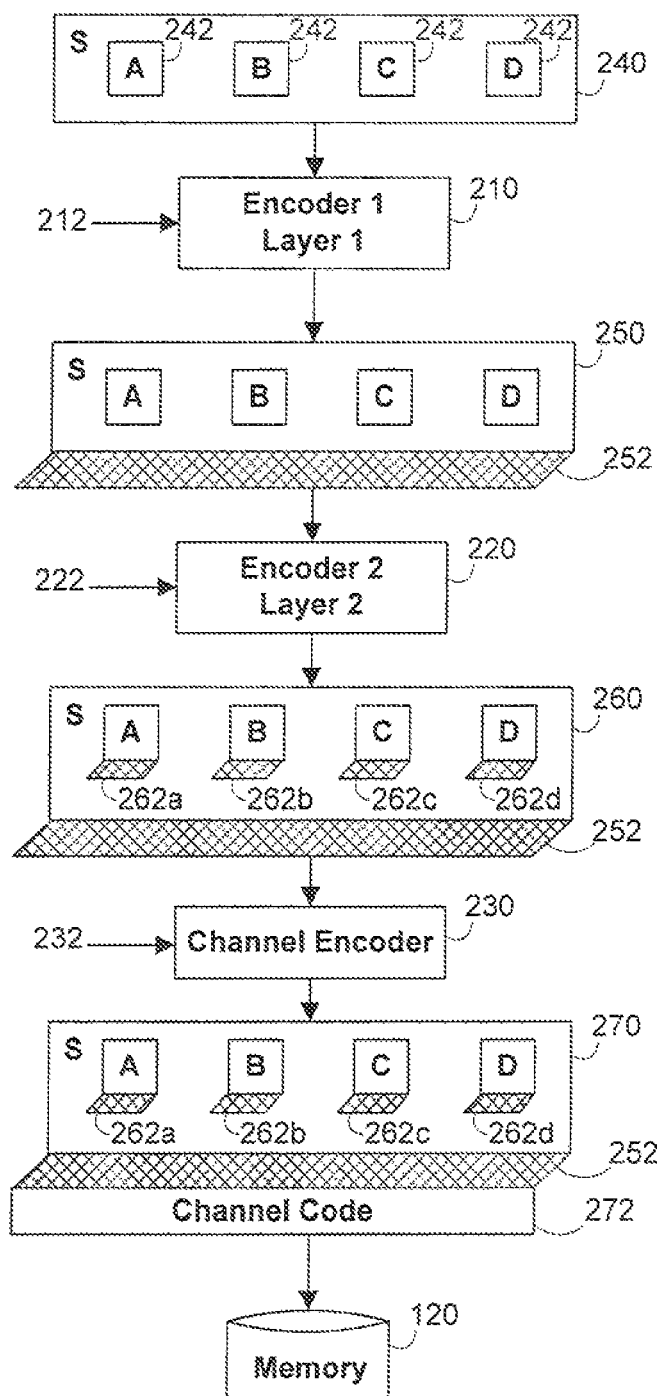
FIG. 2 is a detailed illustration of a multi-layered encoder in accordance with an embodiment of the present invention.

FIG. 2 is a detailed illustration of multi-layered encoder 110 in accordance with an embodiment of the present invention. Encoder 110 may include a first layer encoder 210 and a second layer encoder 220. In some scenarios encoder 110 may also include a third layer encoder such as a channel encoder 230.

A group of data 240 that may include multiple data portions 242 may be received by encoder 110. For example, group of data 240 may be a data sector (S) that may include multiple data pages (A, B, C, D) as data portions 242. First layer encoder 210 may encode all of data portions 242 jointly. In one implementation, first layer encoder 210 is a systematic encoder that appends parity bits resulting from the encoding operation to the end of the data group 240. Appending the parity bits to the end of the data group 240 instead of intermixing the parity bits within the data portions 242 allows the data portions 242 to be decoded individually and increases the efficiency of the system. First layer encoder 210 may be, for example, a Reed-Solomon code (e.g., an 8-way interleaved Reed-Solomon code or a 2-way interleaved Reed-Solomon code), a BHC code, a Hamming code or any other type of algebraic code, preferably in systematic form.

First layer encoder 210 may also receive a set of control signals 212. Control signals 212 may be used to select the type of encoding mechanism that is used for the first layer of encoding. For example, encoder 210 may implement several types of encoders (e.g., Reed-Solomon/BHC) and control signals 212 may instruct first layer encoder 210 to apply one of the types of the encoders and not the other. Alternatively, first layer encoder 210 may be implemented on a programmable device. In such scenarios, control signals 212 may reconfigure or place a different encoding mechanism into first layer encoder 210. Allowing first layer encoder 210 to be reconfigured increases the flexibility of the system by allowing the system to adapt the encoder/decoder based on the data sets.

First layer encoder 210 may output an encoded data group 250. Encoded data group 250 may include coding information 252 (e.g., parity bits) that may be appended to the end of the data set.

Encoded data group 250 may next be further encoded by second layer encoder 220. Second layer encoder 220 may encode individual data portions 242 of data group 240. For example, second layer encoder 220 may encode each data page of a data sector individually. In particular, pages A, B, C and D of data sector S may individually be encoded by second layer encoder 220. This will subsequently, in the decoding processes, allow the individual data portions (e.g., pages A-D) to be decoded separately, thereby obviating the need to read out all of the data pages for decoding as a group. This will be described in more detail in connection with FIGS. 3 and 4. Second layer encoder 220 may be, for example, a Reed-Solomon code (e.g., an 8-way interleaved Reed-Solomon code or a 2-way interleaved Reed-Solomon code), a BHC code or any other type of algebraic code, preferably in systematic form. In an alternate embodiment, the parities generated from the first layer encoder 210 may be encoded by the second layer encoder 220.

Second layer encoder 220 may also receive a set of control signals 222. Control signals 222 may be used to select the type of encoding mechanism that is used for the second layer of encoding. For example, encoder 220 may implement several types of encoders (e.g., Reed-Solomon or BHC) and control signals 222 may instruct second layer encoder 220 to apply one of the types of the encoders and not the other. Alternatively, second layer encoder 220 may be implemented on a programmable device. In such scenarios, control signals 222 may reconfigure or place a different encoding mechanism into second layer encoder 220. Allowing second layer encoder 220 to be reconfigured increases the flexibility of the system by allowing the system to adapt the encoder/decoder based on the data sets.

Second layer encoder 220 may output encoded data set 260 which may include coding information 252 for group of data 240 as well as coding information 262a-d for each individual data portion A-D, respectively, of data group 240.

Encoded data set 260 may be stored directly to memory 120. Alternatively, encoded data set 260 may be further encoded by a third layer encoder 230 such as a channel encoder. The channel encoder may apply a code that is effective for a particular type of transmission medium such as wired or wireless communications medium. The channel encoder may, for example, implement trellis coded modulation (TCM) codes, or low density parity check (LDPC) codes.

Third layer encoder 230 may also receive a set of control signals 232. Control signals 232 may be used to select the type of encoding mechanism that is used for the third layer of encoding. For example, third layer encoder 230 may implement several types of encoders (e.g., TCM, LDPC, Turbo codes, and/or any other types of code applicable to a transmission medium such as wireless or wired communications medium) and control signals 232 may instruct third layer encoder 230 to apply one of the types of the encoders and not the other. Alternatively, third layer encoder 230 may be implemented on a programmable device. In such scenarios, control signals 232 may reconfigure or place a different encoding mechanism into third layer encoder 230. Allowing third layer encoder 230 to be reconfigured increases the flexibility of the system by allowing the system to adapt the encoder/decoder based on the data sets and the communications medium that is used.

Third layer encoder 230 may output channel-encoded data set 270, which may include coding information 252 for group of data 240 as well as coding information 262a-d for each of individual data portions A-D, respectively, of data group 240 and coding information 272 for the channel. Channel-encoded data set 270 may be stored to memory 120 for later retrieval.

Figure 3:
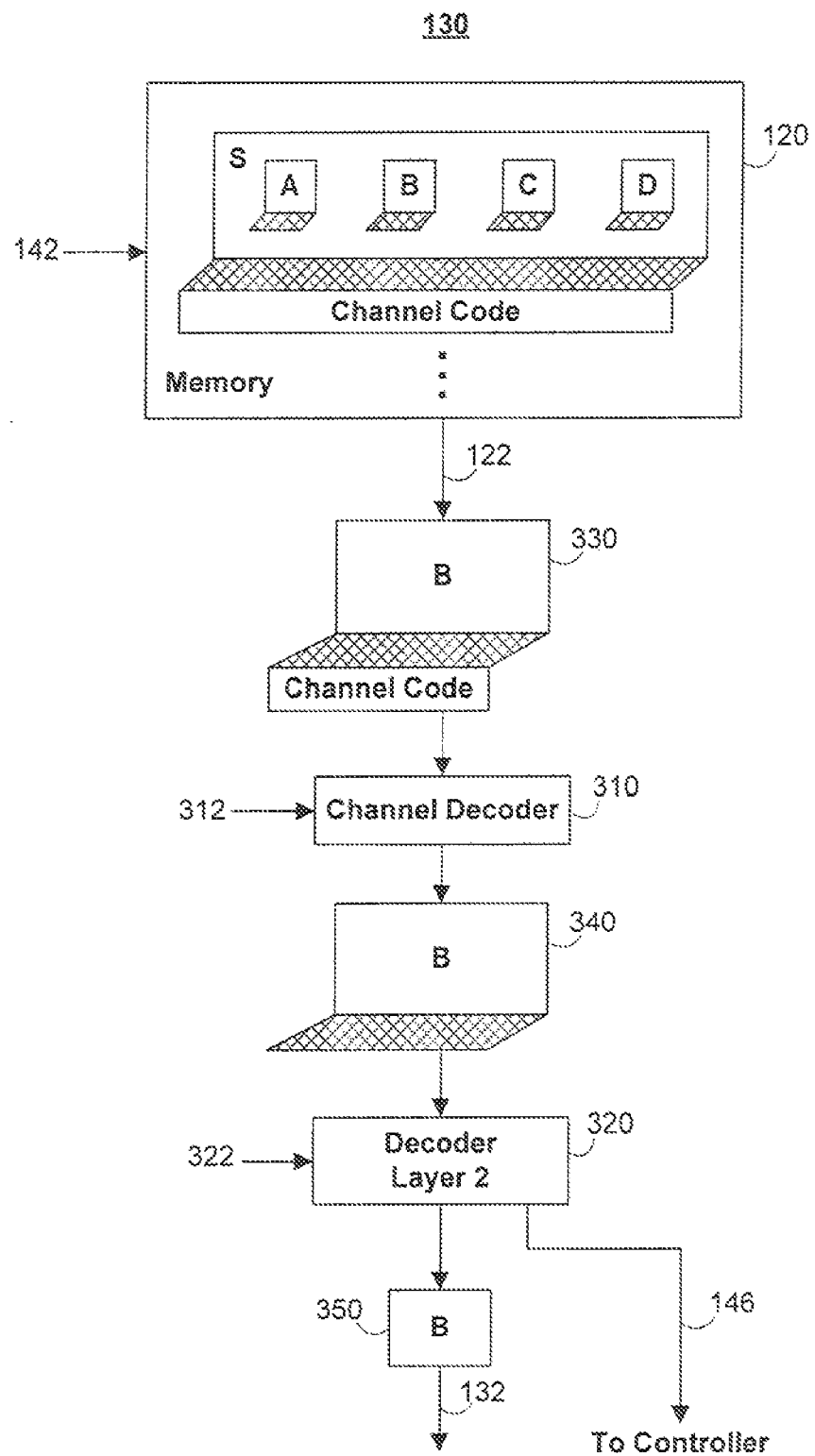
FIGS. 3 and 4 are detailed illustrations of a multi-layered decoder in accordance with an embodiment of the present invention.
Figure 4:
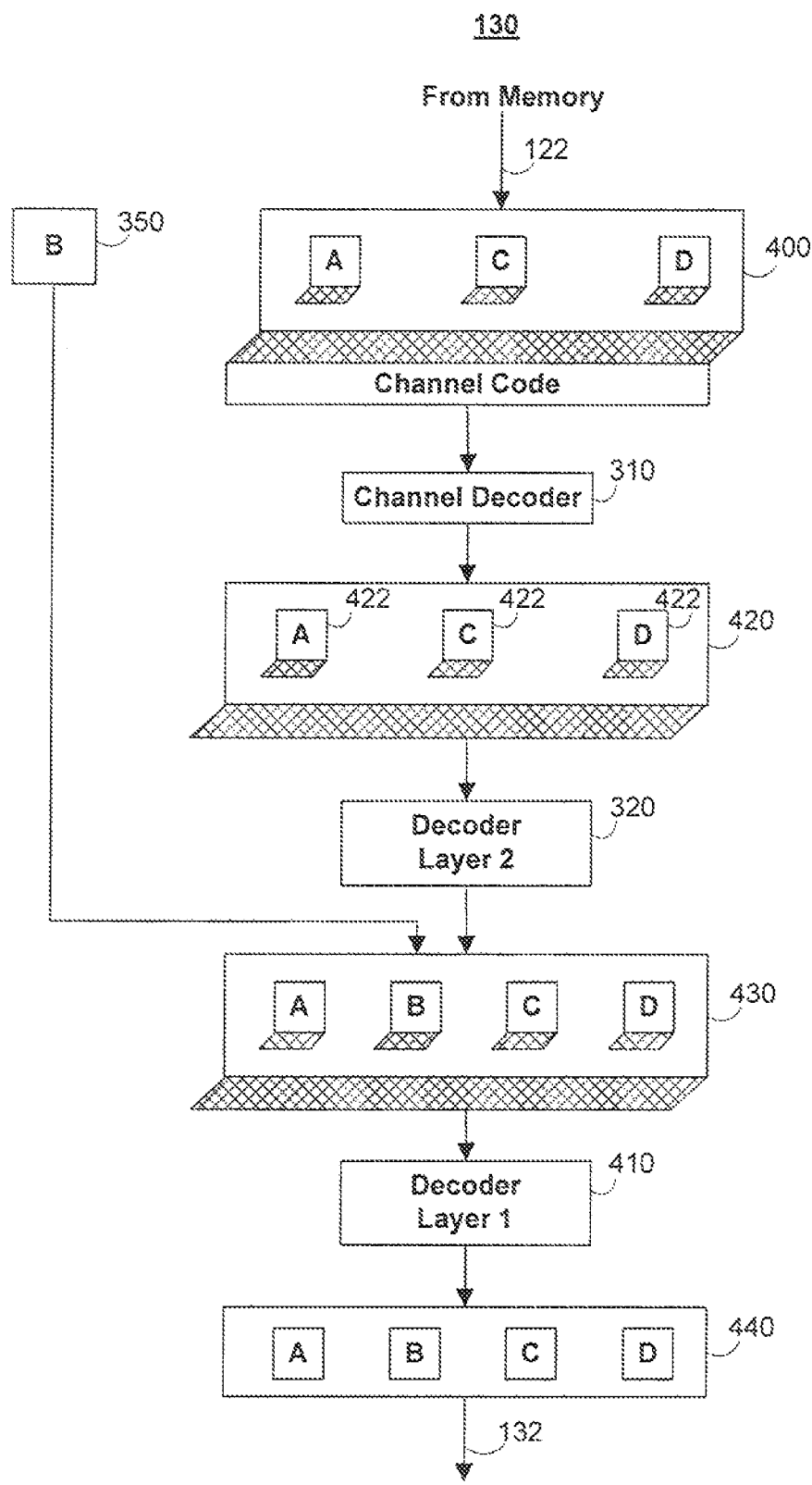

FIGS. 3 and 4 are detailed illustrations of multi-layered decoder 130 in accordance with an embodiment of the present invention. Decoder 130 may include a second layer decoder 320 and a first layer decoder 410. In some scenarios it may be desirable to include a third layer decoder or channel decoder 310 in decoder 130. For example, when encoder 110 applies a channel code to the encoded data set that is stored in memory, decoder 130 can include channel decoder 310.

A processor (not shown) may request to access a particular portion of data (e.g., a page of data). The processor may provide an address of the portion of data either to controller 140 (FIG. 1) or directly to memory 120. Memory 120 may receive the address at an address input through communications link 142 and may output the encoded portion of data 330 that corresponds to the desired address location. Encoded portion of data 122 may be provided to decoder 130 for recovering the original data portion 242 of group of data 240 (FIG. 2). It is important to note that even though data portions 242 have been encoded jointly, because of the encoding mechanism described above in connection with FIG. 2, (in one implementation) the encoded data may be retrieved from memory 120 in encoded portions. This avoids the need to retrieve the encoded group in its entirety when the processor requests access to a single portion of the group of data 240. This makes the system more efficient because it decreases the load on decoder 130 and the amount of data that has to be retrieved from memory 120.

As shown in FIG. 3, an address provided at the input of memory 120 corresponds to encoded data portion 330 (e.g., data page B of sector S). Data portion 330 may be encoded with a channel code in addition to the second layer code. Data portion 330 that is read may include coding information corresponding to the second layer of encoding and coding information corresponding to the third layer or channel encoder. It may not be necessary to read out the coding information corresponding to the first layer of encoding since only a portion of the encoded group of data is being accessed. However, as will be described in more detail below, if the decoder fails to decode the requested portion using only the second and third layer of code, then the remaining portions of the group may be retrieved in addition to the first layer of code to decode all layers of code jointly to recover the requested data portion.

Channel decoder 310 or the third layer decoding may be applied to data portion 330 to decode the channel code from data portion 330. Channel decoder 310 may output data portion 340, which includes coding information corresponding to the second layer of encoding, to second layer decoder 320.

Third layer decoder or channel decoder 310 may also receive a set of control signals 312. Control signals 312 may be used to select the type of decoding mechanism that is used for the third layer of decoding. In one implementation, the decoding mechanism that is selected matches the encoding mechanism that was used by the third layer encoder 230 (FIG. 2). For example, decoder 310 may implement several types of decoders (e.g., TCM, LDPC, Turbo codes and/or other types of code applicable to a transmission medium such as a wireless or wired communications medium) and control signals 312 may instruct third layer decoder 310 to apply one of the types of the decoders and not the other. Alternatively, third layer decoder 310 may be implemented on a programmable device. In such scenarios, control signals 312 may reconfigure or place a different decoding mechanism into third layer encoder 310. Allowing third layer encoder 310 to be reconfigured increases the flexibility of the system by allowing the system to adapt the encoder/decoder based on the data sets and the communications medium that are used.

Second layer decoder 320 receives encoded data portion 340 with the second layer coding information. Second layer decoder 320 may decode encoded data portion 340 using a coding mechanism that matches the type of code used by second layer encoder 220 (FIG. 2).

As discussed above in connection with second layer encoder 220, second layer decoder 320 may also similarly receive control signals 322. Control signals 322 may select a decoding mechanism among a number of different decoding mechanisms that may be implemented on second layer decoder 320. Alternatively, control signals 322 may be used to reconfigure or change the coding mechanism that is implemented on second layer decoder 320 when second layer decoder 320 is implemented on a programmable device.

When the second layer decoding operation succeeds, the output of second layer decoder 320 may be the recovered data portion 350 corresponding to requested data portion 242 of data group 240. Recovered data portion 350 may then be provided to the requesting processor. Additionally, decoder 130 may output status information signals 146 to controller 140 indicating that the decoding operation succeeded.

However, in some circumstances (e.g., when the data is beyond correction using second layer decoding) the second layer decoding operation may fail to recover requested data portion 242. Decoder 130 may then output status information signals through communications link 146 to controller 140 indicating that the decoding operation failed. In such circumstances, an additional layer of decoding (e.g., first layer decoding) may correct the errors that the second layer decoding failed to correct. Thus, controller 140 may retrieve from memory 120 the remaining portions 400 (FIG. 4) of encoded group 270 (FIG. 2) in order to successfully apply the first layer of decoding operation. For example, controller 140 may retrieve the remaining pages (A, C, and D) belonging to second S to decode the remaining pages jointly with page B using first layer decoder 410 (FIG. 4).

As shown in FIG. 4, remaining portions 400, including the first layer coding information, second layer coding information and if applicable, third layer or channel coding information, may be retrieved from memory 120. Typically, remaining portions 400 are stored contiguously in the same block of memory as data portion 350 and thus the memory address locations of remaining portions 400 may be determined from the memory address location of data portion 350. Remaining portions 400 may first be passed through third layer or channel decoder 310 to produce third layer decoded results 420.

Each encoded portion 422 of decoded results 420 may then be provided to second layer decoder 320. This step may be performed in parallel by using multiple second layer decoders 320 for decoding all of encoded portions 422 of the group simultaneously. The second layer decoded results including the second layer decoded portion 350 may be combined with first layer coding information 252 (FIG. 2) to recover encoded data group 250 and form encoded data group 430.

Controller 140 may alternatively retrieve from memory 120 all of the portions of data group 240, although, as discussed above, it may be more efficient to only retrieve the portions of the group which have not been decoded in order to avoid repeating some of the decoding operations. In particular, because data portion 350 has already been decoded by the second layer decoder 320, it would be redundant to retrieve data portion 350 from memory again with the remaining portions only to reapply the third and second layer decoding operations.

Encoded data group 430 may be provided to first layer decoder 410. First layer decoder 410 may decode the portions of the group 430 jointly using the first layer coding information that was created by first layer encoder 210 (FIG. 2). Any failure of second layer decoder 320 may be corrected by first layer decoder 410. In particular, because first layer decoder 410 operates on a larger data set, first layer decoder 410 is capable of correcting errors that a smaller scale decoder such as second layer decoder 320 is not capable of correcting.

As discussed above in connection with first layer encoder 210, first layer decoder 410 may also similarly receive control signals (not shown). The control signals may select a decoding mechanism among a number of different decoding mechanisms that may be implemented on first layer decoder 410. Alternatively, the control signals may be used to reconfigure or change the coding mechanism that is implemented on first layer decoder 410 when first layer decoder 410 is implemented on a programmable device.

The results 440 of first layer decoder 410 are the recovered data group 240 that was an estimate of the data sequence received by encoder 110. The data portion that was requested by the processor may be provided to the processor in addition to all the other portions that belong to the particular group. For example, data page B may be recovered and provided to the requesting processor along with all the other pages of sector S that have been recovered by first layer decoder 410.

Thus, it has been shown that only in some limited circumstances when the second layer (e.g., smaller scale) decoder 320 fails is it necessary to resort to the first layer (e.g., larger scale) decoder 410 to recover a requested data portion. Typically, the processor requests data portions that belong to a group of data and it is therefore only necessary to retrieve that particular data portion and decode the data portion. Only if the decoding operation fails for that data portion, will it be necessary to retrieve the remaining portions of the group to recover the requested data portion.

Figure 5:
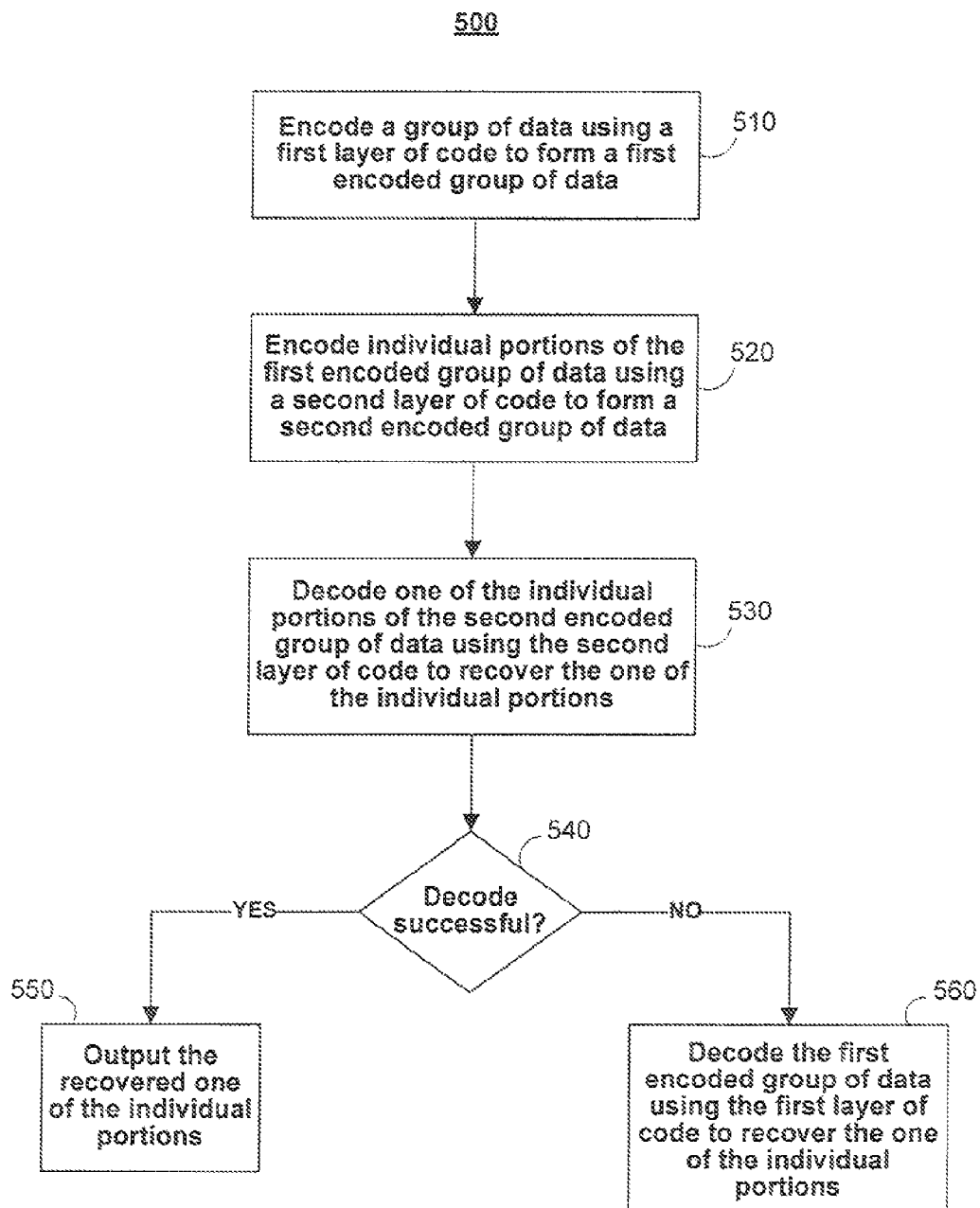
FIG. 5 illustrates a method of performing multi-layered coding in accordance with an embodiment of the present invention.

FIG. 5 illustrates a method 500 of performing multi-layered coding in accordance with an embodiment of the present invention. At step 510, a group of data is encoded using a first layer of code to form a first encoded group of data. For example, data portions 242 included in group of data 240 may be encoded jointly using first layer encoder 210 (FIG. 2). The output of first layer encoder 210 is encoded group of data 250, which includes coding information corresponding to the first layer of code.

At step 520, individual portions of the first encoded group of data are encoded using a second layer of code to form a second encoded group of data. For example, portions 242 of encoded group of data 250 may be encoded individually or independently using second layer encoder 220 (FIG. 2). The output of second layer encoder 220 is encoded group of data 260 that includes coding information corresponding to the first layer of code and coding information 262*a-d* for each of the individual portions of the group.

At step 530, one of the individual portions of the second encoded group of data is decoded using the second layer of code to recover the individual portion. For example, an encoded portion 330 that includes second layer coding information of an encoded group of data may be read from memory 120. Encoded portion 330 may be processed by second layer decoder 320 to recover the individual portion 350 that was initially received by the encoder (FIG. 3).

At step 540, a determination is made as to whether the second layer decoder was successful in recovering the individual portion. For example, controller 140 may receive status information signals through communications link 146 from decoder 130 and may determine whether the decode operation was successful.

At step 550, if the second layer decoder was successful, the recovered individual portion is output to the requesting processor or controller.

At step 560, if the second layer decoder was not successful, the first encoded group of data is decoded using the first layer of code to recover the individual portion. For example, controller 140 may retrieve from memory 120 the remaining encoded portions 400 and decode the remaining encoded portions 400 using second layer decoder 320 (FIG. 4). The encoded individual portions may be combined with the coding information corresponding to the first layer of code and decoded jointly by first layer decoder 410. The output of first layer decoder 410 may include the recovered individual portion that was requested and may be provided to the processor or controller.

Referring now to FIGS. 6A-6G, various exemplary implementations of the present invention are shown.

Figure 6A:
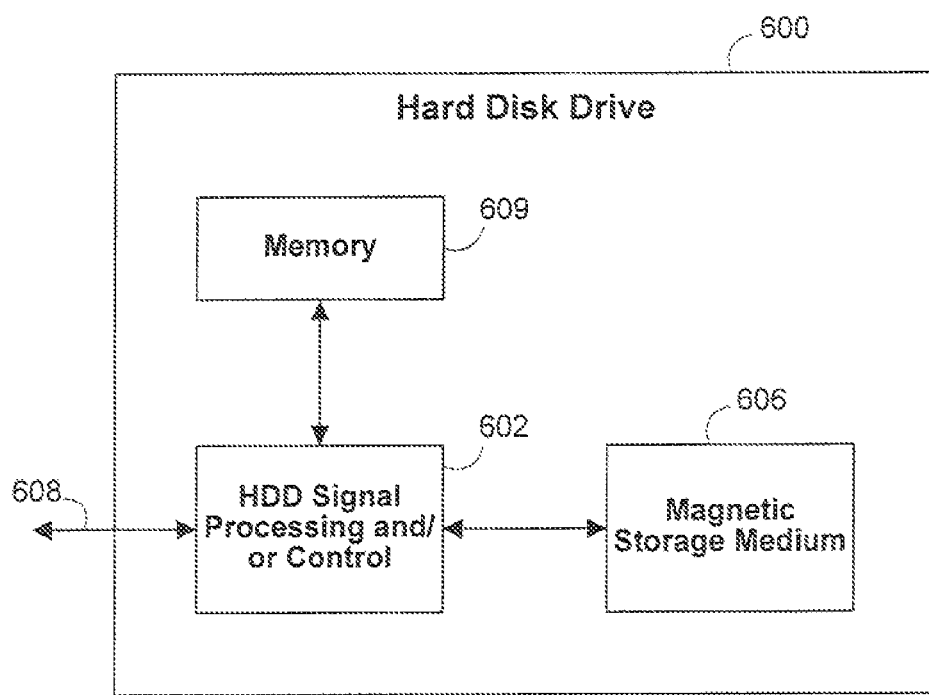
FIG. 6A is a block diagram of an exemplary hard disk drive that can employ the disclosed technology.

Referring now to FIG. 6A, the present invention can be implemented in a hard disk drive (HDD) 600. The present invention may implement either or both signal processing and/or control circuits, which are generally identified in FIG. 6A at 602. In some implementations, the signal processing and/or control circuit 602 and/or other circuits (not shown) in the HDD 600 may process data, perform coding and/or encryption, perform calculations, and/or format data that is output to and/or received from a magnetic storage medium 606.

The HDD 600 may communicate with a host device (not shown) such as a computer, mobile computing devices such as personal digital assistants, cellular phones, media or MP3 players and the like, and/or other devices via one or more wired or wireless communication links 608. The HDD 600 may be connected to memory 609 such as random access memory (RAM), low latency nonvolatile memory such as flash memory, read only memory (ROM) and/or other suitable electronic data storage.

Figure 6B:
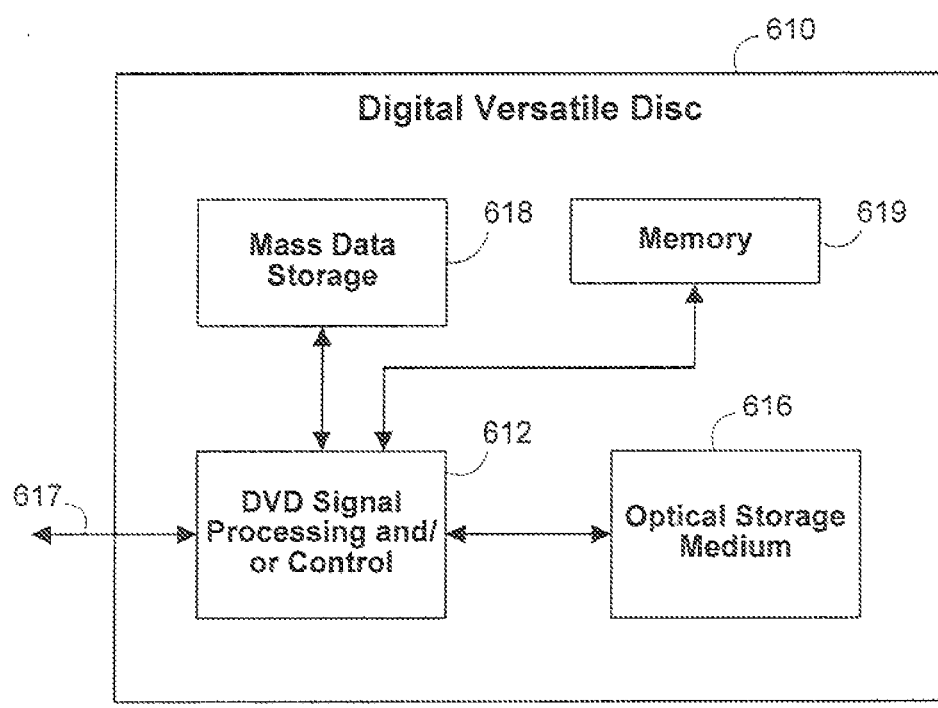
FIG. 6B is a block diagram of an exemplary digital versatile disc that can employ the disclosed technology.

Referring now to FIG. 6B, the present invention can be implemented in a digital versatile disc (DVD) drive 610. The present invention may implement either or both signal processing and/or control circuits, which are generally identified in FIG. 6B at 612, and/or mass data storage 618 of the DVD drive 610. The signal processing and/or control circuit 612 and/or other circuits (not shown) in the DVD 610 may process data, perform coding and/or encryption, perform calculations, and/or format data that is read from and/or data written to an optical storage medium 616. In some implementations, the signal processing and/or control circuit 612 and/or other circuits (not shown) in the DVD 610 can also perform other functions such as encoding and/or decoding and/or any other signal processing functions associated with a DVD drive.

The DVD drive 610 may communicate with an output device (not shown) such as a computer, television or other device via one or more wired or wireless communication links 617. The DVD 610 may communicate with mass data storage 618 that stores data in a nonvolatile manner. The mass data storage 618 may include a hard disk drive (HDD). The HDD 600 may have the configuration shown in FIG. 6A. The HDD 600 may be a mini HDD that includes one or more platters having a diameter that is smaller than approximately 1.8". The DVD 610 may be connected to memory 619 such as RAM, ROM, low latency nonvolatile memory such as flash memory and/or other suitable electronic data storage.

Figure 6C:
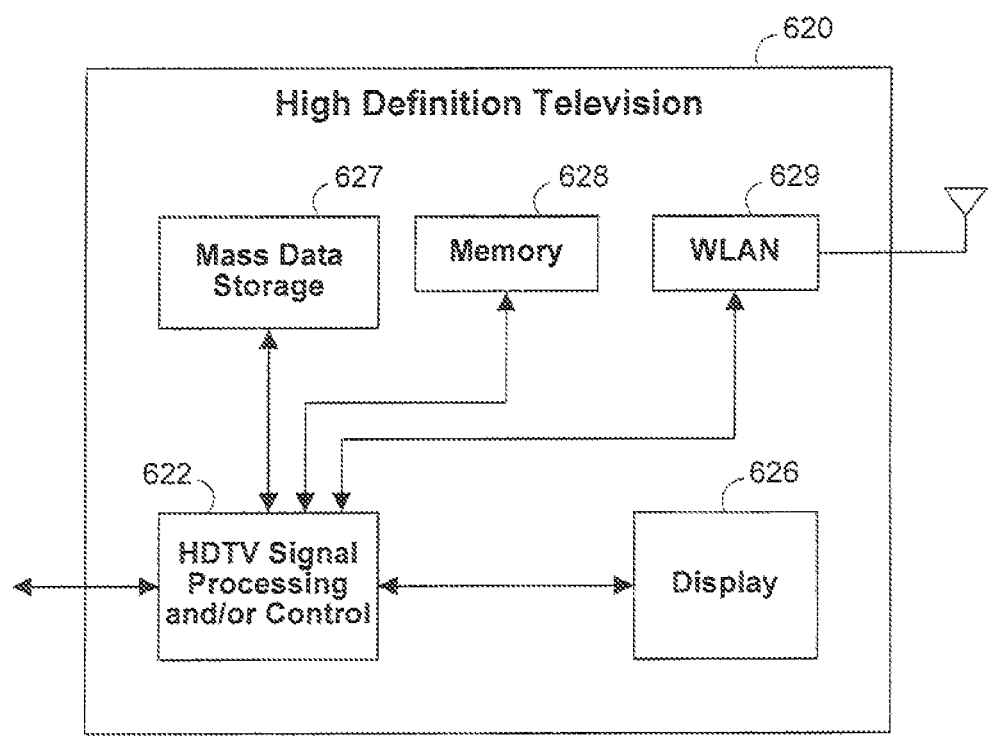
FIG. 6C is a block diagram of an exemplary high definition television that can employ the disclosed technology.

Referring now to FIG. 6C, the present invention can be implemented in a high definition television (HDTV) 620. The present invention may implement either or both signal processing and/or control circuits, which are generally identified in FIG. 6C at 622, a WLAN interface and/or mass data storage of the HDTV 620. The HDTV 620 receives HDTV input signals in either a wired or wireless format and generates HDTV output signals for a display 626. In some implementations, signal processing circuit and/or control circuit 622 and/or other circuits (not shown) of the HDTV 620 may process data, perform coding and/or encryption, perform calculations, format data and/or perform any other type of HDTV processing that may be required.

The HDTV 620 may communicate with mass data storage 627 that stores data in a nonvolatile manner such as optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The HDTV 620 may be connected to memory 628 such as RAM, ROM, low latency nonvolatile memory such as flash memory and/or other suitable electronic data storage. The HDTV 620 also may support connections with a WLAN via a WLAN network interface 629.

Figure 6D:
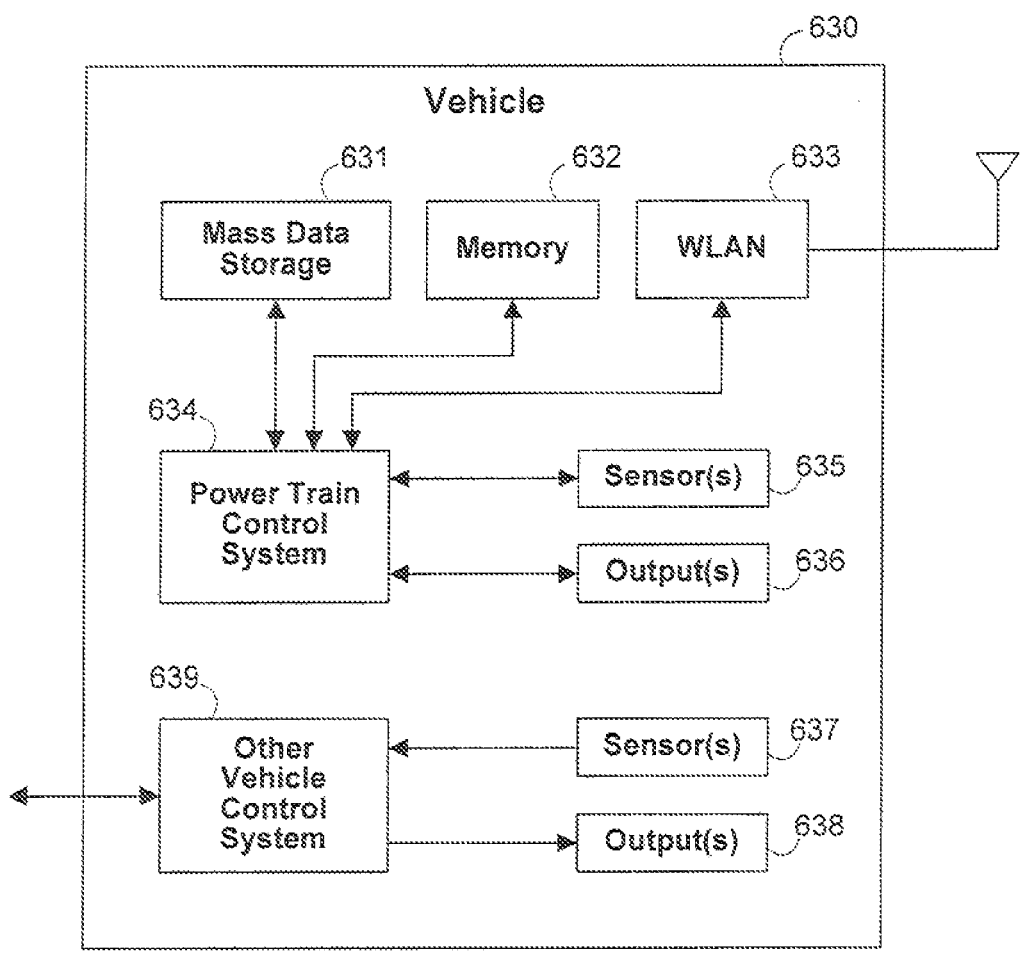
FIG. 6D is a block diagram of an exemplary vehicle that can employ the disclosed technology.

Referring now to FIG. 6D, the present invention implements a control system of a vehicle 630, a WLAN interface and/or mass data storage of the vehicle control system. In some implementations, the present invention may implement a powertrain control system 634 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 639 of the vehicle 630. The control system 639 may likewise receive signals from input sensors 637 and/or output control signals to one or more output devices 638. In some implementations, the control system 639 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 634 may communicate with mass data storage 631 that stores data in a nonvolatile manner. The mass data storage 631 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The powertrain control system 634 may be connected to memory 632 such as RAM, ROM, low latency nonvolatile memory such as flash memory and/or other suitable electronic data storage. The powertrain control system 634 also may support connections with a WLAN via a WLAN network interface 633. The control system 639 may also include mass data storage, memory and/or a WLAN interface (all not shown).

Figure 6E:
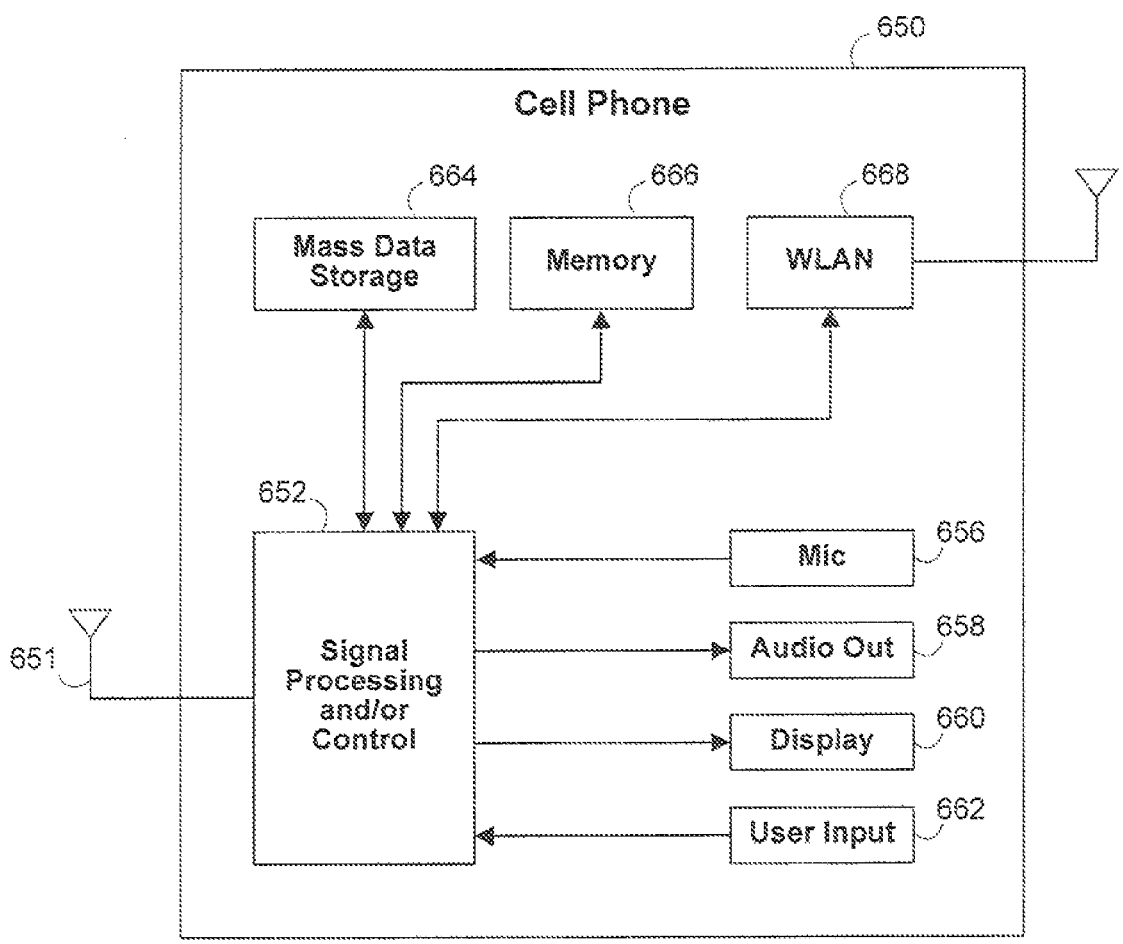
FIG. 6E is a block diagram of an exemplary cell phone that can employ the disclosed technology.

Referring now to FIG. 6E, the present invention can be implemented in a cellular phone 650 that may include a cellular antenna 651. The present invention may implement either or both signal processing and/or control circuits, which are generally identified in FIG. 6E at 652, a WLAN interface and/or mass data storage of the cellular phone 650. In some implementations, the cellular phone 650 includes a microphone 656, an audio output 658 such as a speaker and/or audio output jack, a display 660 and/or an input device 662 such as a keypad, pointing device, voice actuation and/or other input device. The signal processing and/or control circuits 652 and/or other circuits (not shown) in the cellular phone 650 may process data, perform coding and/or encryption, perform calculations, format data and/or perform other cellular phone functions.

The cellular phone 650 may communicate with mass data storage 664 that stores data in a nonvolatile manner such as optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The cellular phone 650 may be connected to memory 666 such as RAM, ROM, low latency nonvolatile memory such as flash memory and/or other suitable electronic data storage. The cellular phone 650 also may support connections with a WLAN via a WLAN network interface 668.

Figure 6F:
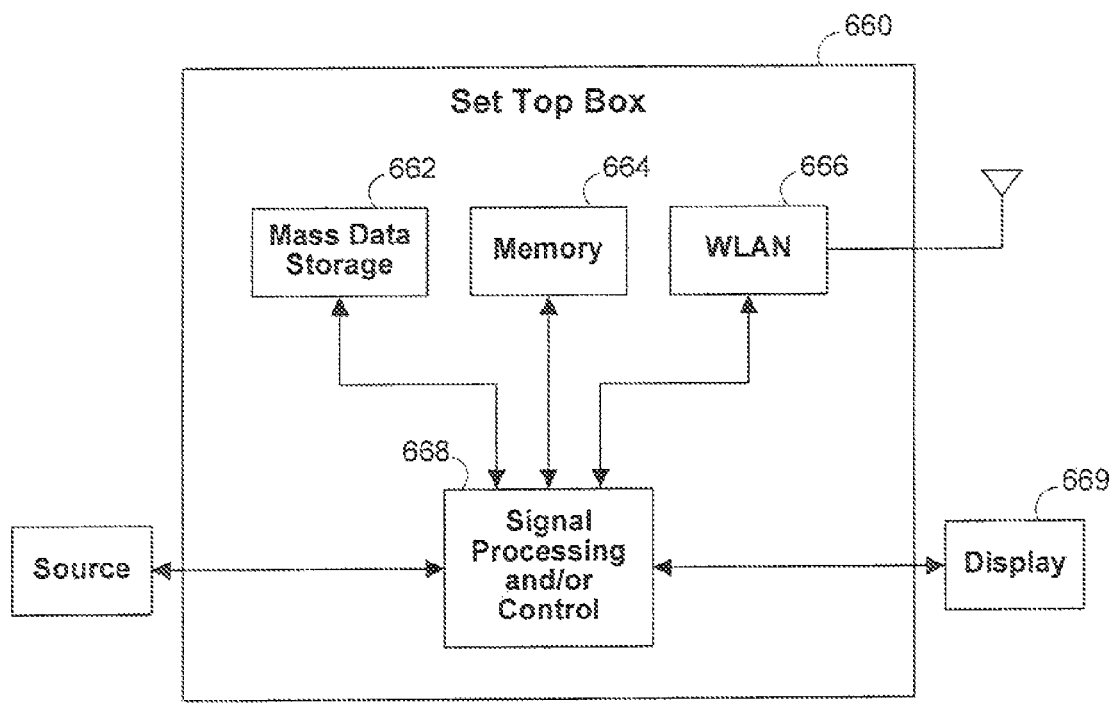
FIG. 6F is a block diagram of an exemplary set top box that can employ the disclosed technology.

Referring now to FIG. 6F, the present invention can be implemented in a set top box 660. The present invention may implement either or both signal processing and/or control circuits, which are generally identified in FIG. 6F at 668, a WLAN interface and/or mass data storage of the set top box 660. The set top box 660 receives signals from a source such as a broadband source and outputs standard and/or high definition audio/video signals suitable for a display 669 such as a television and/or monitor and/or other video and/or audio output devices. The signal processing and/or control circuits 668 and/or other circuits (not shown) of the set top box 660 may process data, perform coding and/or encryption, perform calculations, format data and/or perform any other set top box function.

The set top box 660 may communicate with mass data storage 662 that stores data in a nonvolatile manner. The mass data storage 662 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The set top box 660 may be connected to memory 664 such as RAM, ROM, low latency nonvolatile memory such as flash memory and/or other suitable electronic data storage. The set top box 660 also may support connections with a WLAN via a WLAN network interface 666.

Figure 6G:
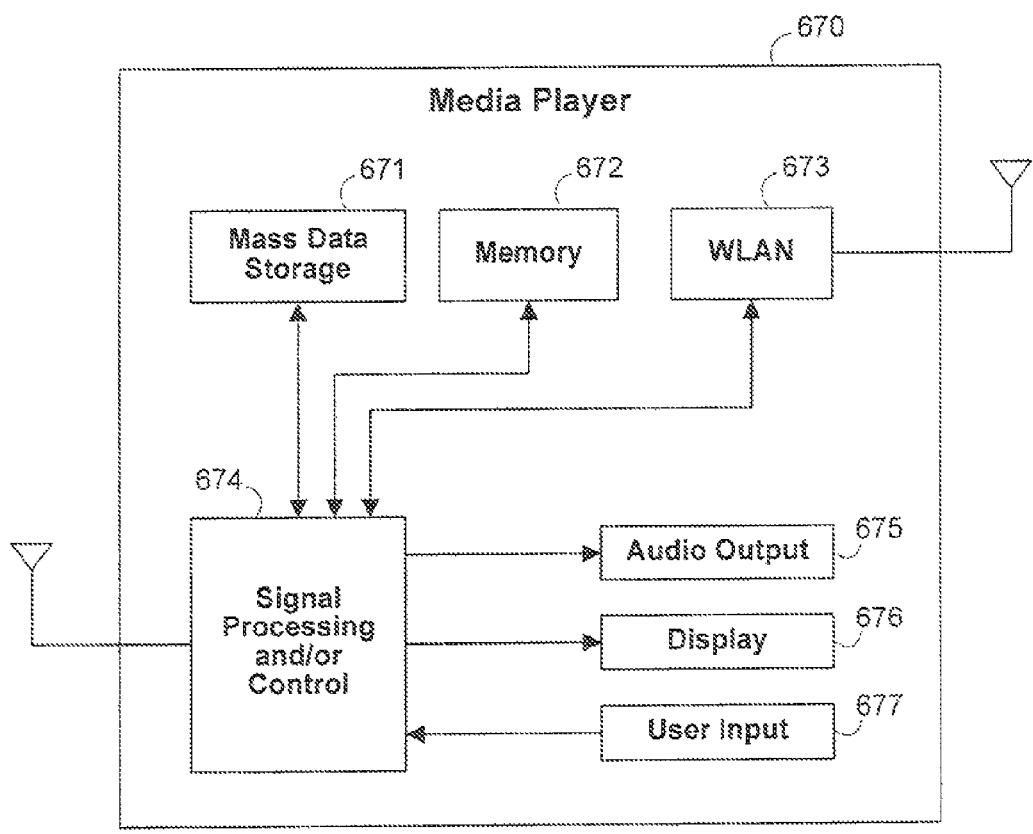
FIG. 6G is a block diagram of an exemplary media player that can employ the disclosed technology.

Referring now to FIG. 6G, the present invention can be implemented in a media player 670. The present invention may implement either or both signal processing and/or control circuits, which are generally identified in FIG. 6G at 674, a WLAN interface and/or mass data storage of the media player 670. In some implementations, the media player 670 includes a display 676 and/or a user input 677 such as a keypad, touchpad and the like. In some implementations, the media player 670 may employ a graphical user interface (GUI) that typically employs menus, drop down menus, icons and/or a point-and-click interface via the display 676 and/or user input 677. The media player 670 further includes an audio output 675 such as a speaker and/or audio output jack. The signal processing and/or control circuits 674 and/or other circuits (not shown) of the media player 670 may process data, perform coding and/or encryption, perform calculations, format data and/or perform any other media player function.

The media player 670 may communicate with mass data storage 671 that stores data such as compressed audio and/or video content in a nonvolatile manner. In some implementations, the compressed audio files include files that are compliant with MP3 format or other suitable compressed audio and/or video formats. The mass data storage 671 may include optical and/or magnetic storage devices for example hard disk drives HDD and/or DVDs. At least one HDD may have the configuration shown in FIG. 6A and/or at least one DVD may have the configuration shown in FIG. 6B. The HDD may be a mini HDD that includes one or more platters having a diameter that is smaller than approximately 1.8". The media player 670 may be connected to memory 672 such as RAM, ROM, low latency nonvolatile memory such as flash memory and/or other suitable electronic data storage. The media player 670 also may support connections with a WLAN via a WLAN network interface 673. Still other implementations in addition to those described above are contemplated.

The foregoing describes systems and methods providing multi-layered coding for memory devices. The above described embodiments of the present invention are presented for the purposes of illustration and not of limitation. Furthermore, the present invention is not limited to a particular implementation. The invention may be implemented in hardware, such as on an application specific integrated circuit (ASIC) or on a field-programmable gate array (FPGA). The invention may also be implemented in software.

What is claimed is:

1. A method for recovering data, the method comprising:
encoding an unencoded group of data using a first layer of error correcting code to form a first encoded group of data;
encoding individual portions of the first encoded group of data using a second layer of error correcting code to form a second encoded group of data, wherein the individual portions are encoded independently of each other;
decoding one of the individual portions of the second encoded group of data using the second layer of error correcting code to recover one of the individual portions of the unencoded group of data; and
retrieving each of the remaining individual portions of the second encoded group from a memory, simultaneously decoding at least some of the retrieved remaining portions using the second layer of error correcting code, and decoding the first encoded group of data using the first layer of error correcting code to recover the one of the individual portions of the unencoded group of data when the decoding using the second layer of error correcting code on the one of the individual portions of the second encoded group of data fails to recover the one of the individual portions of the unencoded group of data.

2. The method of claim 1 further comprising:
encoding the second encoded group of data using a third layer of code to form a third encoded group of data; and
decoding one of the individual portions of the third encoded group of data corresponding to the one of the individual portions of the second encoded group of data.

3. The method of claim 2 wherein each of the first layer of error correcting code and the second layer of error correcting code is Reed-Solomon code or BCH code, and the third layer of code is a Trellis Coded Modulation (TCM) code, Low Density Parity Check (LDPC) code, or Turbo code.

4. The method of claim 1 wherein decoding the first encoded group of data comprises:
decoding each of the retrieved remaining portions using the second layer of error correcting code to form a first decoded group; and
decoding individual portions of the first decoded group jointly.

5. The method of claim 1 further comprising:
bypassing the decoding of the first encoded group of data when the decoding using the second layer of error correcting code succeeds in recovering the one of the individual portions of the unencoded group of data; and
providing data recovered by the decoding of the one of the individual portions of the second encoded group to processing circuitry.

6. The method of claim 1 further comprising providing data recovered by the decoding of the first encoded group of data to processing circuitry.

7. The method of claim 1 wherein:
the unencoded group of data comprises a plurality of data pages; and
each of the individual portions comprises one of the plurality of data pages.

8. The method of claim 1 wherein:
the first encoded group of data comprises an unencoded parity portion;
the encoding individual portions of the first encoded group of data further encodes the unencoded parity portion using the second layer of error correcting code to form an encoded parity portion; and
the decoding one of the individual portions of the second encoded group of data further decodes the encoded parity portion encoded using the second layer of error correcting code.

9. A system for recovering data, the system comprising:
a first encoder operable to encode an unencoded group of data using a first layer of error correcting code to form a first encoded group of data;
a second encoder operable to encode individual portions of the first encoded group of data using a second layer of error correcting code to form a second encoded group of data, wherein the individual portions are encoded independently of each other;
a first decoder operable to decode one of the individual portions of the second encoded group of data using the second layer of error correcting code to recover one of the individual portions of the unencoded group of data; and
a second decoder operable to retrieve each of the remaining individual portions of the second encoded group from a memory, simultaneously decode at least some of the retrieved remaining portions using the second layer of error correcting code, and decode the first encoded group of data using the first layer of error correcting code to recover the one of the individual portions of the unencoded group of data when the first decoder fails to recover the one of the individual portions of the unencoded group of data.

10. The system of claim 9 further comprising:
a third encoder operable to encode the second encoded group of data using a third layer of code to form a third encoded group of data; and
a third decoder operable to decode one of the individual portions of the third encoded group of data corresponding to the one of the individual portions of the second encoded group of data using the third layer of code.

11. The system of claim 10 wherein each of the first layer of error correcting code and the second layer of error correcting code is Reed-Solomon code or BCH code, and the third layer of code is a Trellis Coded Modulation (TCM) code, Low Density Parity Check (LDPC) code, or Turbo code.

12. The system of claim 9 further comprising a controller operable to:
instruct the first decoder to decode each of the retrieved remaining portions using the second layer of error correcting code to form a first decoded group; and
instruct the second decoder to decode individual portions of the first decoded group jointly.

13. The system of claim 9 further comprising a controller operable to:
bypass the second decoder when the first decoder succeeds in recovering the one of the individual portions of the unencoded group of data; and
provide data recovered by the first decoder of the one of the individual portions of the second encoded group to processing circuitry.

14. The system of claim 9 further a controller operable to provide data recovered by the second decoder of the first encoded group of data to processing circuitry.

15. The system of claim 9 wherein:
the unencoded group of data comprises a plurality of data pages; and
each of the individual portions comprises one of the plurality of data pages.

16. The system of claim 9 wherein:
the first encoded group of data comprises an unencoded parity portion;
the second encoder is further operable to encode the unencoded parity portion using the second layer of error correcting code to form an encoded parity portion; and
the first decoder is further operable to decode the encoded parity portion encoded using the second layer of error correcting code.

17. An apparatus for recovering data, the apparatus comprising:
means for encoding an unencoded group of data using a first layer of error correcting code to form a first encoded group of data;
means for encoding individual portions of the first encoded group of data using a second layer of error correcting code to form a second encoded group of data, wherein the individual portions are encoded independently of each other;
means for decoding one of the individual portions of the second encoded group of data using the second layer of error correcting code to recover one of the individual portions of the unencoded group of data; and
means for retrieving each of the remaining individual portions of the second encoded group from a memory, simultaneously decoding at least some of the retrieved remaining portions using the second layer of error correcting code, and decoding the first encoded group of data using the first layer of error correcting code to recover the one of the individual portions of the unencoded group of data when the means for decoding using the second layer of error correcting code on the one of the individual portions of the second encoded group of data fails to recover the one of the individual portions of the unencoded group of data.

18. The apparatus of claim 17 further comprising:
means for encoding the second encoded group of data using a third layer of code to form a third encoded group of data; and
means for decoding one of the individual portions of the third encoded group of data corresponding to the one of the individual portions of the second encoded group of data.

19. The apparatus of claim 18 wherein each of the first layer of error correcting code and second layer of error correcting code is Reed-Solomon code or BCH code, and the third layer of code is a Trellis Coded Modulation (TCM) code, Low Density Parity Check (LDPC) code, or Turbo code.

20. The apparatus of claim 17 wherein the means for decoding the first encoded group of data comprises:
means for decoding each of the retrieved remaining portions using the second layer of error correcting code to form a first decoded group; and
means for decoding individual portions of the first decoded group jointly.

21. The apparatus of claim 17 further comprising:
means for bypassing the decoding of the first encoded group of data when the means for decoding using the second layer of error correcting code succeeds in recovering the one of the individual portions of the unencoded group of data; and
means for providing data recovered by the decoding of the one of the individual portions of the second encoded group to means for processing the one of the individual portions of the unencoded group of data.

22. The apparatus of claim 17 wherein:
the unencoded group of data comprises a plurality of data pages; and
each of the individual portions comprises one of the plurality of data pages.

23. The apparatus of claim 17 wherein:
the first encoded group of data comprises an unencoded parity portion;
the means for encoding individual portions of the first encoded group of data further encodes the unencoded parity portion using the second layer of error correcting code to produce an encoded parity portion; and
the means for decoding one of the individual portions of the second encoded group of data further decodes the encoded parity portion encoded using the second layer of error correcting code.

* * * * *